United States Patent
Yoshioka et al.

(10) Patent No.: US 11,546,016 B2
(45) Date of Patent: Jan. 3, 2023

(54) PSEUDO-SINUSOIDAL WAVEFORM GENERATOR FOR HART COMMUNICATION

(71) Applicant: Texas Instruments Incorporated, Dallas, TX (US)

(72) Inventors: Masahiro Yoshioka, Allen, TX (US); Michael Douglas Snedeker, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/205,287

(22) Filed: Mar. 18, 2021

(65) Prior Publication Data

US 2022/0302956 A1  Sep. 22, 2022

(51) Int. Cl.
| | |
|---|---|
| H04B 3/46 | (2015.01) |
| H03K 3/037 | (2006.01) |
| H03M 1/66 | (2006.01) |
| H04B 3/30 | (2006.01) |
| H04L 12/02 | (2006.01) |

(52) U.S. Cl.
CPC ............... *H04B 3/46* (2013.01); *H03K 3/037* (2013.01); *H03M 1/66* (2013.01); *H04B 3/30* (2013.01); *H04L 12/02* (2013.01)

(58) Field of Classification Search
CPC .......... H04B 3/46; H04B 3/30; H03K 3/037; H03M 1/66; H04L 12/02; H04L 25/08; G01D 3/08
See application file for complete search history.

(56) References Cited

U.S. PATENT DOCUMENTS

| | | | |
|---|---|---|---|
| 6,307,441 B1 | 10/2001 | Sharpe | |
| 2013/0131834 A1* | 5/2013 | Meagher | G05B 19/02 700/10 |
| 2015/0030089 A1* | 1/2015 | Alley | H04L 12/40032 375/257 |
| 2017/0201401 A1* | 7/2017 | Lovell | H04L 27/1563 |

FOREIGN PATENT DOCUMENTS

| | | | | |
|---|---|---|---|---|
| WO | WO-2004051860 A2 * | 6/2004 | | H03M 1/68 |
| WO | 2016089384 A1 | 6/2016 | | |

OTHER PUBLICATIONS

ON Semiconductor, http://onsemi.com, AND8346/D, A519HRT Hart (R) Modem, Aug. 2014—Rev. 4, 20 pgs.
International Search Report, Application No. PCT/US2022/020677, dated Jun. 30, 2022, 5 pgs.

* cited by examiner

*Primary Examiner* — Sophia Vlahos
(74) *Attorney, Agent, or Firm* — John R. Pessetto; Frank D. Cimino

(57) ABSTRACT

A communication system includes a first system input adapted to be coupled to a DC transient current transitioning between a starting level and a target level on a pseudo-sinusoidal path and incudes a second system input adapted to be coupled to a HART signal. The system includes an adder circuit having an output, a first adder input coupled to the first system input and a second adder input coupled to the second system input. The adder circuit provides a superimposed signal comprising the HART signal and the DC transient current.

14 Claims, 5 Drawing Sheets

PSEUDO-SINUSOIDAL WAVEFORM GENERATOR FOR HART COMMUNICATION

TECHNICAL FIELD

This description relates generally to HART communication.

BACKGROUND

HART (Highway Addressable Remote Transducer) protocol is an open standard used to send and receive digital information using analog wiring between remote field devices and control systems. These field devices are known as HART devices and they can be installed in process control systems, instrumentation systems and in other industrial applications. HART devices support two simultaneous communication channels on the same wire: a 4-20 mA analog communication channel; and a HART digital communication channel.

In order to be HART-compliant, HART devices must pass HART compliance tests. One of the requirements is the analog rate of change test which ensures analog signaling conditions do not adversely affect HART signals by spilling over into the digital signaling domain. Because large and fast step changes in analog current can interfere with HART communication, the fastest rate of change of the analog current should not result in spikes greater than 150 mV at the output of a digital test filter. This requirement guarantees that step changes in a DC current do not generate frequency components that spill over into the digital signaling domain.

In order to pass the analog rate of change test, the slew rate of the analog current must be reduced so that its bandwidth is limited to about 25 Hz. It is possible to meet this requirement by limiting the bandwidth of the analog current to 25 Hz, but this increases propagation delay from a transmitter to a receiver. It is also possible to meet this requirement by digital slew rate control but only at extremely slow digital slew rates.

SUMMARY

In one aspect, a communication system includes a first system input adapted to be coupled to a DC transient current transitioning between a starting level and a target level on a pseudo-sinusoidal path and incudes a second system input adapted to be coupled to a HART signal. The system includes an adder circuit having an output, a first adder input coupled to the first system input and a second adder input coupled to the second system input. The adder circuit provides a superimposed signal comprising the HART signal and the DC transient current.

In an additional aspect, the DC transient current rises from a first starting level to a mid point between the first starting level and a first target level at an accelerating slew rate and rises from the mid point to the first target level at a decelerating slew rate. The DC transient current falls from a second starting level to the mid point at the accelerating slew rate and falls from the mid point to a second target level at the decelerating slew rate.

In an additional aspect, a communication system includes a pseudo-sinusoidal waveform generator configured to provide a digital-to-analog converter (DAC) code. The system includes a digital-to-current converter configured to receive the DAC code and to provide a DC transient current. The DC transient current rises from a first starting level to a mid point between the first starting level and a first target level at an accelerating slew rate and rises from the mid point to the first target level at a decelerating slew rate. The DC transient current falls from a second starting level to the mid point at the accelerating slew rate and falls from the mid point to a second target level at the decelerating slew rate. The system includes an input adapted to be coupled to a HART signal. The system includes an adder circuit having an output, a first input coupled to the DC transient signal and a second input adapted to be coupled to the HART signal.

In an additional aspect, the system includes an analog filter having an output and an input coupled to the output of the adder circuit and includes a digital filter having an output and an input coupled to the output of the adder circuit.

In an additional aspect, the analog filter is a low-pass filter configured to isolate the analog signaling spectrum, and the digital filter is a band-pass filter configured to isolate the digital signaling spectrum.

In an additional aspect, a communication system includes a step selector having a first input configured to receive a positive slew value, a second input configured to receive a negative slew value, and a third input configured to receive a comparison signal. The step selector is configured to provide a slew step responsive to the comparison signal. The system includes a first adder circuit having a first input configured to receive the slew step and a second input configured to receive a stored slew rate. The first adder circuit is configured to provide a current slew rate at an output. The system includes a memory device having an input configured to receive the current slew rate and to provide the stored slew rate. The system includes a second adder circuit having a first input configured to receive the current slew rate and a second input configured to receive a digital-to-analog converter (DAC) code. The second adder circuit is configured to provide a next DAC code raw signal at an output. The system includes a latch having an input configured to receive the next DAC code raw signal and a rising-edge clock input configured to receive a clock signal. The latch is configured to provide the DAC code. The system includes a comparison circuit having a first input configured to receive the DAC code and a second input configured to receive a transition value. The comparison circuit provides the comparison signal at an output. The system includes a digital-to-current converter configured to receive the DAC code and to provide a DC transient current. The DC transient current rises from a first starting level to a mid point between the first starting level and a first target level at an accelerating slew rate and rises from the mid point to the first target level at a decelerating slew rate. The DC transient current falls from a second starting level to the mid point at the accelerating slew rate and falls from the mid point to a second target level at the decelerating slew rate.

DETAILED DESCRIPTION

Figure 1:
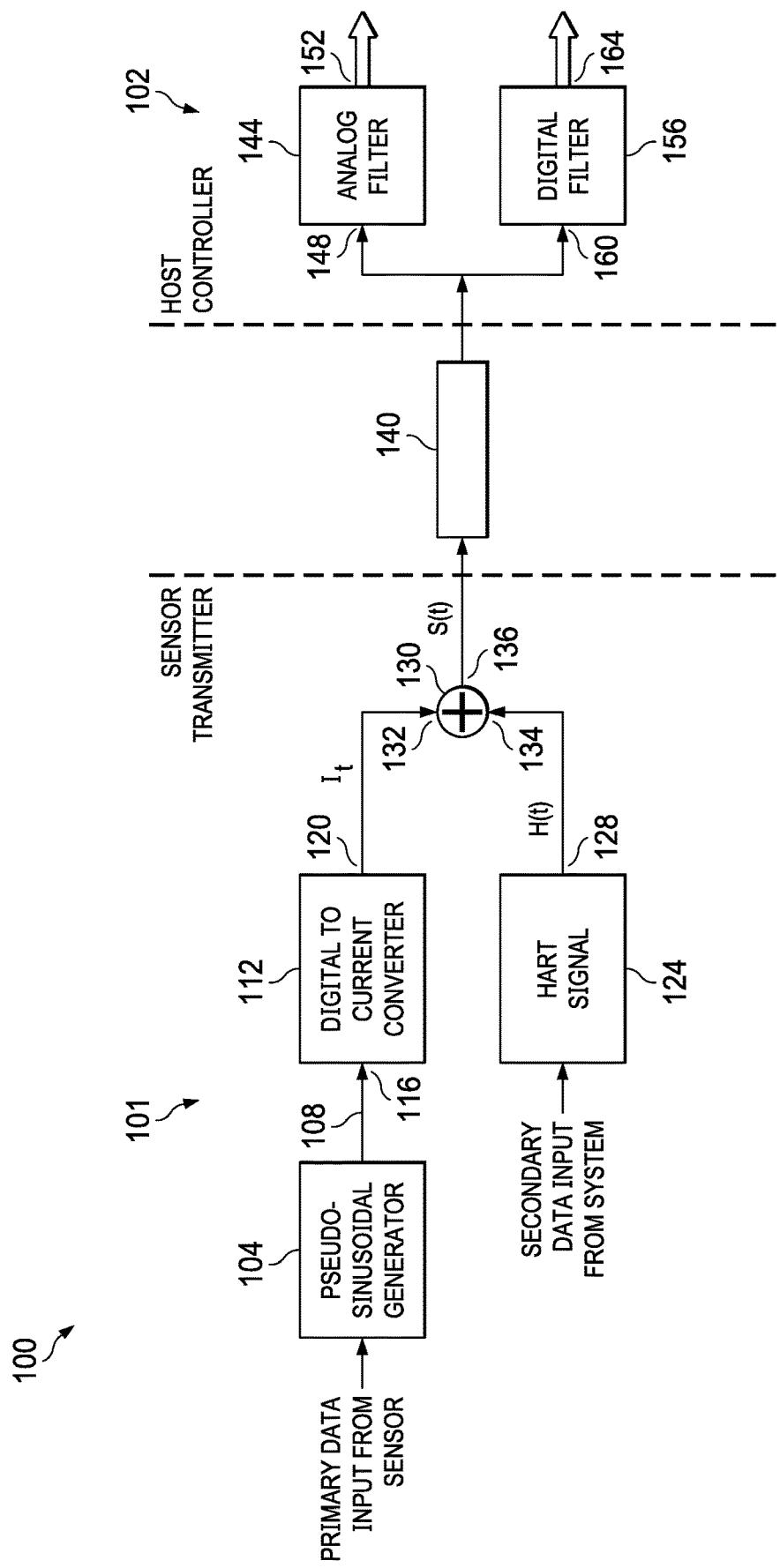
FIG. 1 is a block diagram of a system of an example embodiment.

FIG. 1 is a block diagram of a system 100 of an example embodiment. The system 100 includes a sensor transmitter 101 which communicates with a host controller 102. The sensor transmitter 101 is adapted to receive input from a sensor which can be a field measurement device such as, for example, a pressure sensor, a level sensor, a temperature sensor, or a flow sensor. The sensor transmitter 101 includes a primary data transfer path and a secondary data transfer path. The primary data transfer path of the sensor transmitter 101 includes a pseudo-sinusoidal waveform generator 104 which provides a digital-to-analog converter (DAC) code at an output 108. The DAC code is a digital signal. The primary data transfer path of the sensor transmitter 101 includes a digital-to-current converter circuit 112 which has an input 116 configured to receive the DAC code. The digital-to-current converter circuit 112 converts the DAC code to a DC transient current $I_t$ and provides $I_t$ at an output 120. The DC transient current $I_t$ has a variable DC level that transitions from a starting level to a target level on a pseudo-sinusoidal path. In other embodiments, a conventional digital-to-analog converter (DAC) which provides a voltage signal can be used instead of the digital-to-current converter 112. By using the pseudo-sinusoidal waveform generator 104 on the primary data transfer path, data interference between the primary and second data transfer paths is prevented. In an example embodiment, the DC transient current $I_t$ is a 4 mA-20 mA analog signal.

Figure 2A:
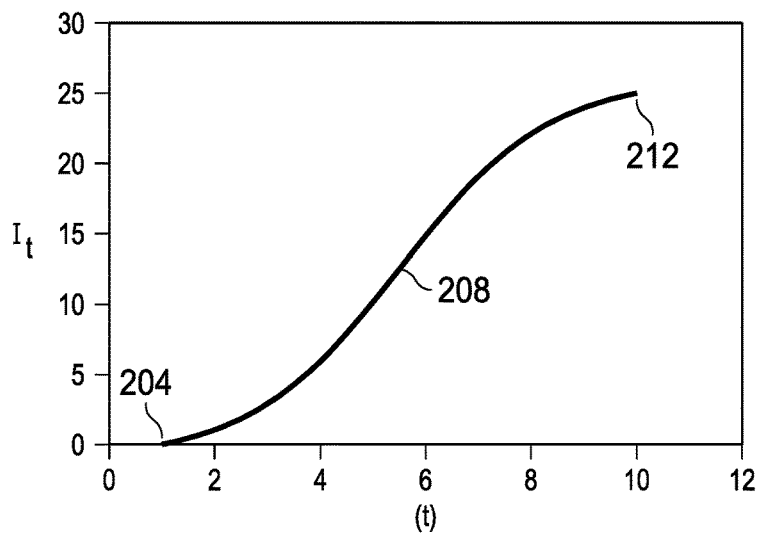
FIGS. 2A-2B illustrate DC transient current provided by a signal generator of the system.
Figure 2B:
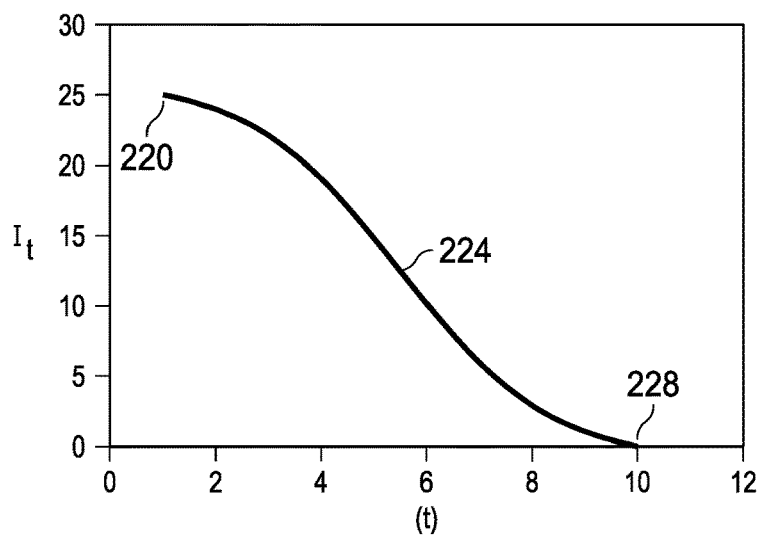

FIGS. 2A-2B illustrate the DC transient current $I_t$. In FIG. 2A, the DC transient current $I_t$ rises from a first starting level 204 at an accelerating slew rate to a mid-point 208, and the DC transient current $I_t$ rises at a decelerating slew rate from the mid-point 208 to a first target level 212. In FIG. 2B, the DC transient current $I_t$ falls from a second starting level 220 at an accelerating slew rate to a mid-point 224, and the DC transient current $I_t$ falls at a decelerating slew rate from the mid-point 224 to a second target level 228. The DC transient current $I_t$ traces a pseudo-sinusoidal path during its rise and its fall due to the accelerating and the decelerating slew rate. In FIGS. 2A-2B, the time (t) required to transition between the starting level and the target level is dependent on the slew rate of $I_t$, and thus the horizontal axis (t) can be assigned suitable units of time (e.g. milliseconds, microseconds) based on the slew rate. In some example embodiments, FIG. 2B may follow immediately after FIG. 2A (i.e., point 212 is connected to point 220 to create a continuous signal.

Figure 3:
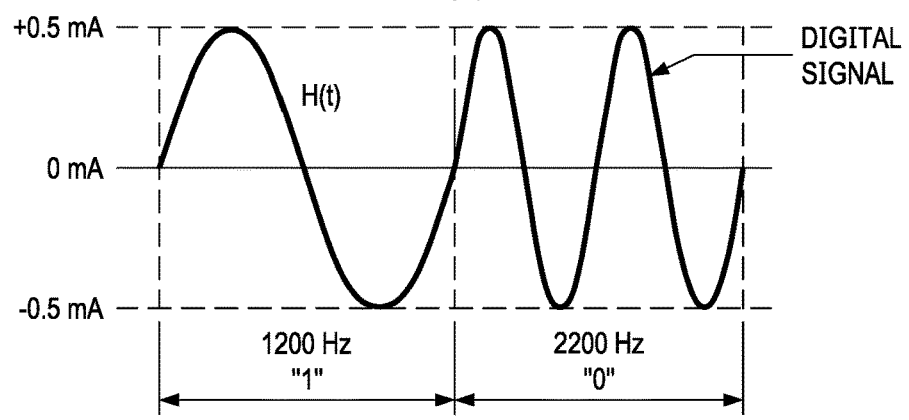
FIG. 3 illustrates an example HART signal.

The secondary data transfer path includes a HART transmitter 124 which provides a HART signal H(t) at an output 128. In an example embodiment, the HART signal H(t) is generated by using frequency shift keying (FSK) in which 1.2 kHz and 2.2 kHz are used to represent binary 1 and binary 0 values, respectively. As explained below, the HART signal is used to communicate secondary sensor information. FIG. 3 illustrates the HART signal H(t) transmitted by the HART transmitter 124.

The system 100 includes an adder circuit 130 having a first input 132 configured to receive the DC transient current $I_t$ and a second input 134 configured to receive the HART signal H(t). The adder circuit 130 provides a superimposed signal S(t) at an output 136. The superimposed signal S(t) comprises H(t) superimposed over $I_t$. The superimposed signal S(t) is transmitted to the host controller 102 via a connector 140. The connector 140 can, for example, be a current loop formed by a pair of wires. In other embodiments, the connector 140 can be a single wire, a bus or any other electrical connector.

The host controller 102 includes an analog filter 144 having an input 148 coupled to the connector 140. The host controller 102 includes a digital filter 156 having an input 160 coupled to the connector 140. The analog filter 144 and the digital filter 156 have respective outputs 152 and 164.

The analog filter 144 receives the superimposed signal S(t) over the connector 140. The analog filter 144 is configured to isolate an analog signaling spectrum of the HART communication system from the superimposed signal S(t). In an example embodiment, the analog filter 144 is a low-pass filter which has a cutoff frequency at 25 Hz so that signals above 25 Hz are attenuated at the output 152.

The digital filter 156 receives the superimposed signal S(t) over the connector 140. The digital filter 156 is configured to isolate a digital signaling spectrum of the HART communication system from the superimposed signal S(t). In an example embodiment, the digital filter 156 is a band-pass filter which has a pass band between 500 Hz and 10 kHz.

The system 100 provides two simultaneous communication channels: the analog signal (i.e., DC transient current), which is around 4-20 mA in some example embodiments, and a digital signal (i.e., HART signal). The analog signal (i.e., the DC transient current) communicates the primary value (e.g., temperature, pressure, flow-rate) measured by the sensor. Secondary sensor information is communicated using the digital signal that is superimposed over the analog signal. The digital signal may, for example, contain device status, diagnostics and additional measured or calculated values. Together, the two communication channels provide a low-cost, robust solution.

As discussed before, large and fast step change of the analog current interferes with the HART signal by spilling over into the digital signaling domain. To avoid large and fast step change, the DC transient signal $I_t$ provided by the signal generator 104 follows a pseudo-sinusoidal path. The DC transient signal $I_t$ rises from the first starting level to the mid-point at an accelerating slew rate and rises from the mid-point to the first target level at a decelerating slew rate and falls from the second starting level to the mid-point at an accelerating slew rate and falls from the mid-point to the second target level at a decelerating slew rate. In an example embodiment, the first starting level is 4 mA and the first target level is 20 mA, and the second starting level is 20 mA and the second target level is 4 mA.

In other embodiments, the DC transient signal $I_t$ rises from the first starting level to a first predetermined transition point at an accelerating slew rate and rises from the first predetermined transition to the first target level at a decelerating slew rate and falls from the second starting level to a second predetermined transition point at an accelerating slew rate and falls from the second predetermined transition point to the second target level at a decelerating slew rate. The first predetermined transition point can be a selected point between the first starting level and the first target level, and the second predetermined transition point can be a selected point between the second starting level and the second target level.

Because the DC transient $I_t$ signal does not have a shunt slew rate change during its transition, the bandwidth of the DC transient signal $I_t$ can be limited so that the signal $I_t$ does not generate frequency components that spill over into the digital signaling domain. The DC transient signal $I_t$ does not cause spikes greater than 150 mV at the output of the digital test filter and thus does not interfere with HART signal H(t). Thus, the system 100 is HART communication protocol compliant. Furthermore, the settling time of $I_t$ is improved (i.e., faster), thereby reducing propagation delay between HART devices (e.g. industrial equipment, sensors, measurement equipment or other types of automotive or non-industrial equipment) and controllers (e.g. a computer, server or other type of processing device).

Figure 4:
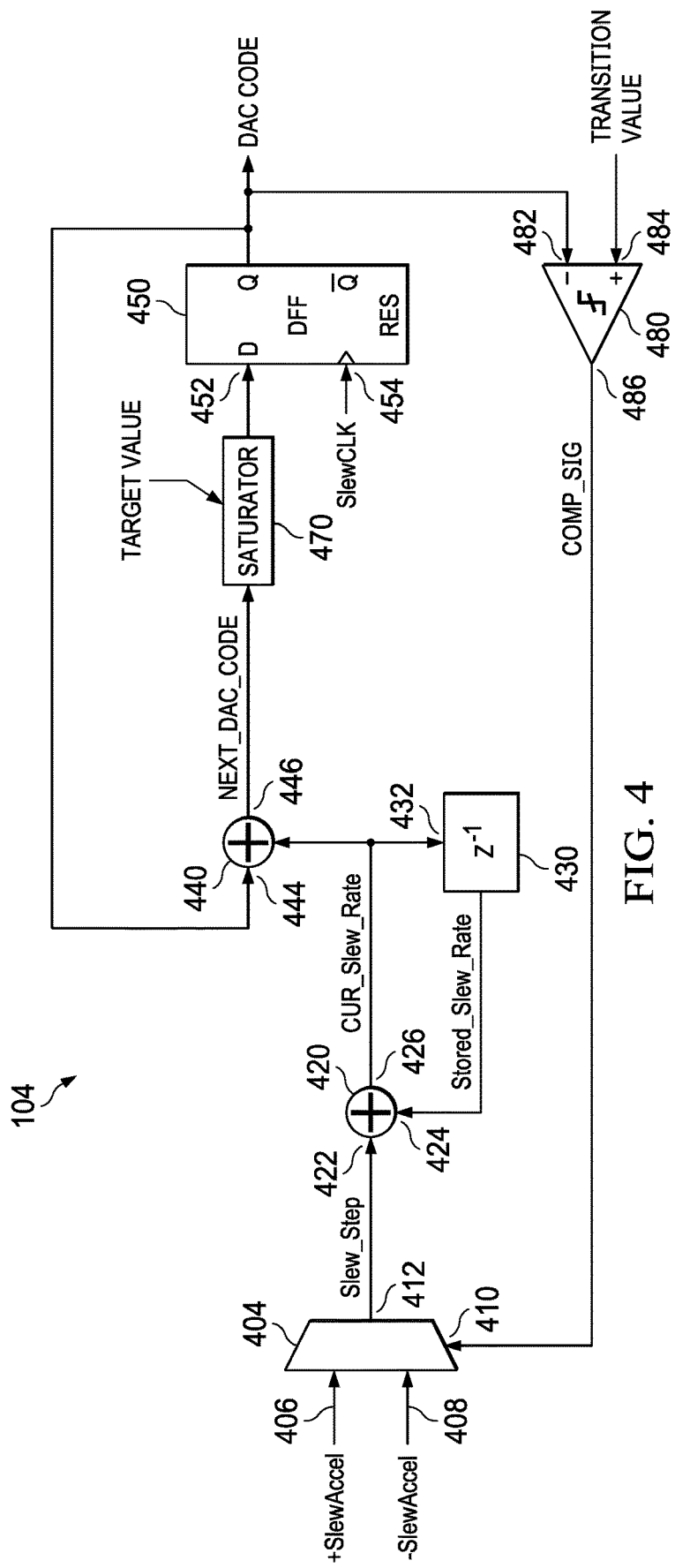
FIG. 4 is a schematic diagram of a waveform generator of an example embodiment.

FIG. 4 is a schematic diagram of the waveform generator 104 of an example embodiment. The waveform generator 104 is configured to provide the DAC code. The waveform generator 104 includes a step selector 404 which has a first input 406 configured to receive a positive slew value (referred to as +SlewAccel in FIG. 4), a second input 408 configured to receive a negative slew value (referred to as −SlewAccel in FIG. 4), and a third input 410 configured to receive a comparison signal. The step selector 404 is configured to select either the positive or the negative slew value responsive to the comparison signal and provide the selected slew value as a slew step Slew_Step at an output 412. In an example embodiment, the step selector 404 is a multiplexer configured to either select the positive or the negative slew value responsive to the comparison signal. The step selector 404 switches from the positive slew value to the negative slew value and switches from the negative slew value to the positive slew value when the comparison signal crosses a predetermined transition value (also referred to as a transition point).

The waveform generator 104 includes a first adder circuit 420 which has a first input 422 configured to receive the slew step Slew_Step and a second input 424 configured to receive a stored slew rate Stored_Slew_Rate. The adder circuit 420 is configured to provide a current slew rate Cur_Slew_Rate at an output 426. The waveform generator 104 includes a memory unit 430 which has a first input 432 configured to receive the current slew rate Cur_Slew_Rate. The memory unit 430 stores the current slew rate value and provides that stored value as the stored slew rate Stored_Slew_Rate to the first adder circuit 420. The first adder circuit 420 adds the Slew_Step and the Stored_Slew_Rate and provides the current slew rate Cur_Slew_Rate.

The waveform generator 104 includes a second adder circuit 440 which has a first input 442 configured to receive the current slew rate Cur_Slew_Rate and a second input 444 configured to receive the DAC code DAC_CODE. The second adder circuit 440 provides a next DAC code raw signal NEXT_DAC_CODE_RAW at an output 446.

In an example embodiment, a saturator 470 compares NEXT_DAC_CODE_RAW to a predetermined target or limit value. If NEXT_DAC_CODE_RAW exceeds the target value, the saturator 470 limits the NEXT_DAC_COD-E_RAW to the target value and provides the target or limit value as the Next_DAC_CODE_RAW as the output. If Next_DAC_CODE_RAW does not exceed the target or limit value, the saturator 470 provides Next_DAC_CODE_RAW as the output.

The waveform generator 104 includes a latch 450 which has an input 452 coupled to receive the output of the saturator 470 (i.e., NEXT_DAC_CODE_RAW) and has a rising-edge clock input 454 coupled to receive a clock signal (referred to as SlewCLK in FIG. 4). The latch 450 is configured to provide the DAC code DAC_CODE at a Q output. In an example embodiment, the latch 450 is a multi-bit D flip-flop. The digital to current converter 116 (shown in FIG. 1) converts DAC_CODE to the DC transient current $I_t$.

The waveform generator 104 includes a comparison circuit 480 which has a first input 482 configured to receive DAC_CODE and a second input 484 configured to receive a transition value. The comparison circuit 482 provides the comparison signal COMP_SIG at an output. In an example embodiment, the transition value is the mid-point between a starting value of DAC_CODE and a target value of DAC_CODE. The comparison signal indicates if DAC_CODE is below or above the transition value.

Table A below lists Slew_Step (i.e., output of the step selector 404), Cur_Slew_Rate (i.e., output of the adder 420), NEXT_DAC_CODE_RAW (i.e., output of the saturator 470) and change in DAC_CODE at the Q output of the latch 450. In Table A, DAC_CODE rises from a starting value=0 to a target value=24. The mid-point between the starting value and the target value, which is referred to as the transition point, is (0+24)/2=12.

TABLE A

| Cycle | Slew_Step | Cur_Slew_Rate | NEXT_DAC_CODE_RAW | Change in DAC_CODE |
|---|---|---|---|---|
| 1 | 1 | 1 | 1 | 0->1 |
| 2 | 1 | 2 | 3 | 1->3 |
| 3 | 1 | 3 | 6 | 3->6 |
| 4 | 1 | 4 | 10 | 6->10 |
| 5 | 1 | 5 | 15 | 10->15 |
| 6 | −1 | 4 | 19 | 15->19 |
| 7 | −1 | 3 | 22 | 19->22 |
| 8 | −1 | 2 | 24 | 22->24 |
| 9 | −1 | 1 | 25 | 24 |

With reference to Table A, in cycles 1-5, the step selector 404 selects the positive slew value (+1 or "1") (i.e., Slew_Step=+1). In response, the output of the first adder circuit 420 (i.e., Cur_Slew_Rate) rises linearly from 1 to 5, causing the output of the second adder circuit 440 (i.e., NEXT_DAC_CODE_RAW) to rise from 1 to 15. In cycle 6, DAC_CODE exceeds the transition point (i.e., 12), thus the step selector 404 selects the negative slew value (−1) (i.e., Slew_Step=−1). In cycle 8, DAC_CODE reaches the target value (i.e., 24). Thus, DAC_CODE is limited to 24 by the saturator 470 in cycle 9.

TABLE B lists Slew_Step (i.e., output of the step selector 404), Cur_Slew_Rate (i.e., output of the adder 420), NEXT_DAC_CODE_RAW (i.e., output of the saturator 470) and change in DAC_CODE at the Q output of latch 450. In Table B, DAC_CODE falls from a starting value=24 to a target value=0. The mid-point between the starting value and the target value, which is referred to as the transition point, is (0+24)/2=12.

TABLE B

| Cycle | Slew_Step | Cur_Slew_Rate | NEXT_DAC_CODE_RAW | Change in DAC_CODE |
|---|---|---|---|---|
| 1 | −1 | −1 | 23 | 24->23 |
| 2 | −1 | −2 | 21 | 23->21 |
| 3 | −1 | −3 | 18 | 21->18 |
| 4 | −1 | −4 | 14 | 18->14 |
| 5 | −1 | −5 | 9 | 14->9 |
| 6 | 1 | −4 | 5 | 9->5 |
| 7 | 1 | −3 | 2 | 5->2 |
| 8 | 1 | −2 | 0 | 2->0 |
| 9 | 1 | −1 | 0 | 0 |

With reference to Table B, in cycles 1-5, the step selector 404 selects the negative slew value (−1) (i.e., Slew_Step=−1). In response, the output of the first adder circuit 420 (i.e., Cur_Slew_Rate) falls linearly from −1 to −5, causing the output of the second adder circuit 440 to fall at an accelerating slew rate from 24 to 14. In cycle 6, DAC_CODE falls below the transition point (i.e., 12), thus the step selector 404 selects the positive slew value (i.e., Slew_Step=+1). In cycle 9, DAC_CODE reaches the target value (i.e., 0). Thus, the DAC_CODE is limited to 0 by the saturator 470.

Figure 5:
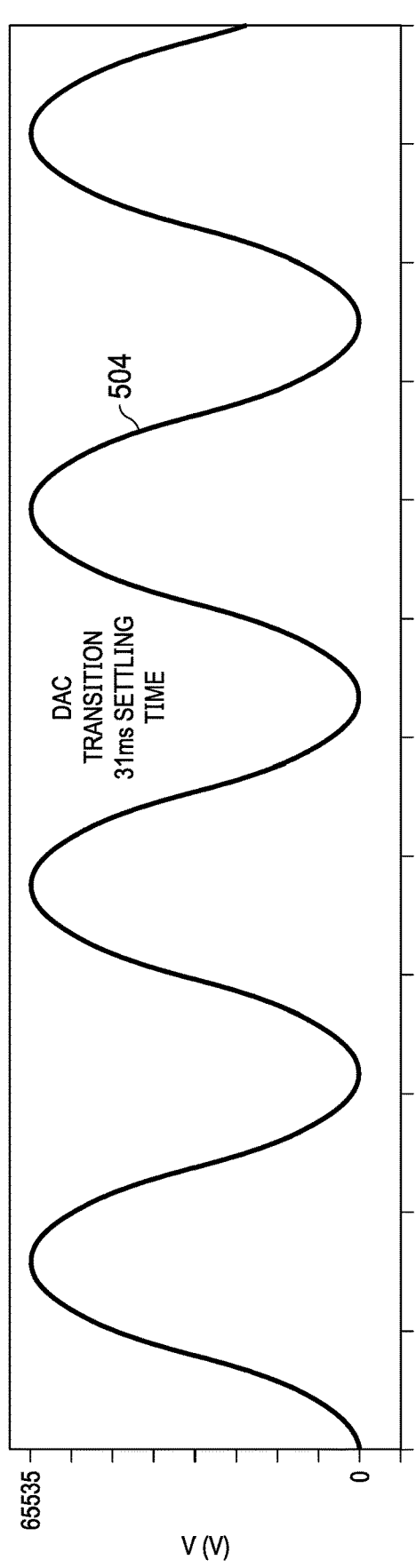
FIG. 5 illustrates DC transient current and an output of a digital filter.
Figure 5:
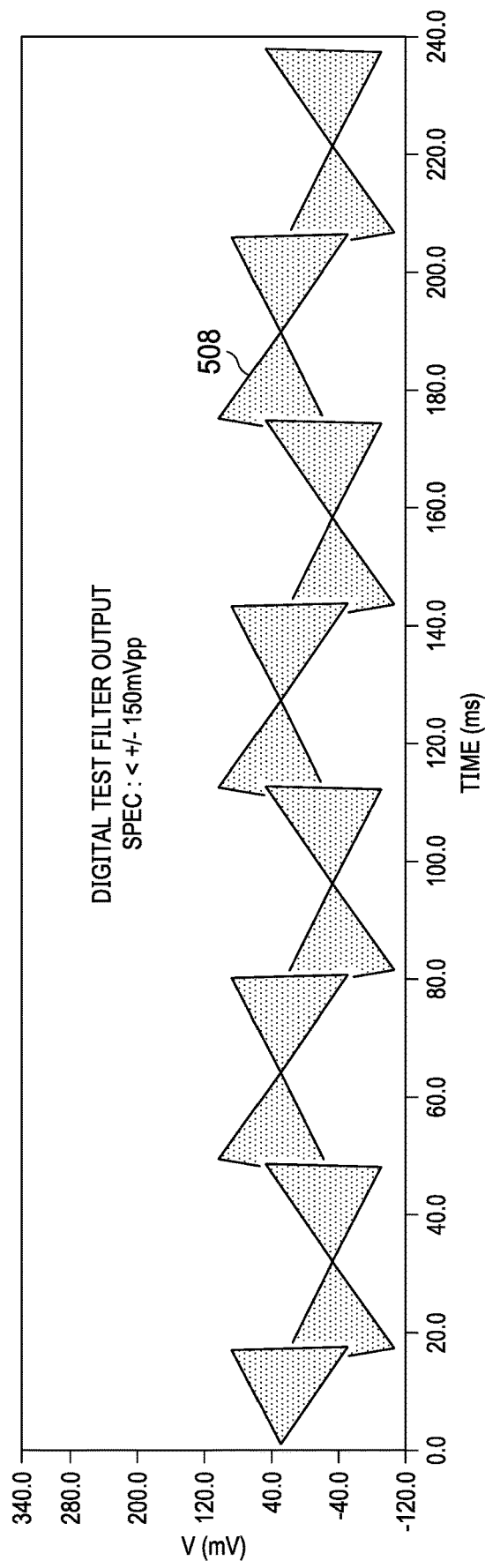

FIG. 5 illustrates simulated waveforms of DAC_CODE (504) and an output (508) of the digital test filter 156 of an example embodiment. In this example, DAC_CODE has 16 bit resolution and transitions from 0 to 65535 and from 65535 to 0, and has a 31 ms settling time. The digital test filter output (508) remains below +/−150 mV peak-to-peak voltage due to the pseudo-sinusoidal waveform generator. Thus, the system is HART protocol-compliant.

Figure 6:
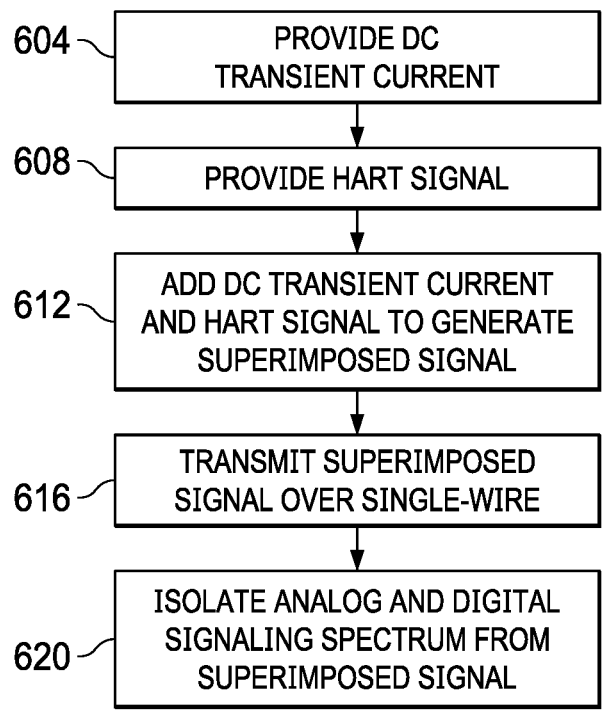
FIG. 6 is a flow diagram of a method of an example embodiment.

FIG. 6 is a flow diagram of a method of an example embodiment. In a block 604, a DC transient current is provided. As described before, in an example embodiment, the waveform generator 104 provides the DAC code which is converted to the DC transient current by the digital to current converter 112. The DC transient current rises from a first starting level at an accelerating slew rate to a mid-point, and rises at a decelerating slew rate from the mid-point to a first target level. The DC transient current falls from a second starting level at an accelerating slew rate to a mid-point, and falls at a decelerating slew rate from the mid-point to a second target level. The DC transient current traces a pseudo-sinusoidal path during its rise and fall due to the accelerating and the decelerating slew rates.

In a block 608, a HART signal is provided. As described before, the HART signal can be provided by a HART transmitter 124. In an example embodiment, the HART signal is generated by using frequency shift keying (FSK) in which 1.2 kHz and 2.2 kHz are used to represent binary 1 and binary 0 values, respectively.

In a block 612, the DC transient current and the HART signal are added and a superimposed signal is provided. The superimposed signal includes an analog signaling spectrum and a digital signaling spectrum of HART communication protocol. In a block 616, the superimposed signal is transmitted via a HART protocol-compliant connector. In a block 620, the superimposed signal is received and the analog signaling spectrum and the digital signaling spectrum are isolated. As described before, in an example embodiment the analog signaling spectrum can be isolated using a low pass filter having a cutoff frequency above 25 Hz, and the digital signaling spectrum can be isolated using a band-pass filter having a pass band between 500 Hz and 20 KHz, for example.

In this description, the term "couple" may cover connections, communications, or signal paths that enable a functional relationship consistent with this description. For example, if device A provides a signal to control device B to perform an action, then: (a) in a first example, device A is coupled to device B; or (b) in a second example, device A is coupled to device B through intervening component C if intervening component C does not substantially alter the functional relationship between device A and device B, such that device B is controlled by device A via the control signal provided by device A. Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, in this description, a circuit or device that includes certain components may instead be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device or other electronics or semiconductor component.

While certain components may be described herein as being of a particular process technology, these components may be exchanged for components of other process technologies. Circuits described herein are reconfigurable to include the replaced components to provide functionality at least partially similar to functionality available before the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in series or in parallel between the same two nodes as the single resistor or capacitor. Also, uses of the phrase "ground terminal" in this description include a chassis ground, an Earth ground, a floating ground, a virtual ground, a digital ground, a common ground, and/or any other form of ground connection applicable to, or suitable for, the teachings of this description. Unless otherwise stated, "about", "approximately", or "substantially" preceding a value means +/−10 percent of the stated value.

Modifications are possible in the described embodiments, and other embodiments are possible, within the scope of the claims.

What is claimed is:

1. A Highway Addressable Remote Transducer (HART) communication system comprising:
    a first system input adapted to be coupled to a DC transient current transitioning between a starting level and a target level on a pseudo-sinusoidal path;
    a second system input adapted to be coupled to a HART signal;
    an adder circuit having an output, a first adder input coupled to the first system input and a second adder input coupled to the second system input.

2. The HART communication system of claim 1, wherein the adder circuit is configured to provide a superimposed signal comprising the HART signal and the DC transient current.

3. The HART communication system of claim 1, further comprising:
    a waveform generator configured to provide a digital-to-analog converter (DAC) code; and
    a digital-to-current converter configured to receive the DAC code.

4. The communication system of claim 1, further comprising:
    an analog filter having an output and an input coupled to the output of the adder circuit; and
    a digital filter having an output and an input coupled to the output of the adder circuit.

5. The HART communication system of claim 4, wherein the analog filter is a low-pass filter configured to isolate an analog signaling spectrum.

6. The communication system of claim 4, wherein the digital filter is a band-pass filter configured to isolate a digital signaling spectrum.

7. A communication system, comprising:
    a waveform generator configured to provide a digital-to-analog converter (DAC) code;
    a digital-to-current converter configured to receive the DAC code and to provide a DC transient current transitioning between a starting level and a target level on a pseudo-sinusoidal path;
    an adder circuit having an output, a first input coupled to the DC transient signal and a second input adapted to be coupled to a Highway Addressable Remote Transducer (HART) signal.

8. The communication system of claim 7, wherein the adder circuit is configured to add the DC transient current and the HART signal and provide a superimposed signal having an analog signaling spectrum and a digital signaling spectrum of a HART communication protocol.

9. The communication system of claim 7, further comprising:
    an analog filter having an output and an input coupled to the output of the adder circuit; and
    a digital filter having an output and an input coupled to the output of the adder circuit.

10. The HART communication system of claim 9, wherein the analog filter is a low-pass filter configured to isolate an analog signaling spectrum.

11. The communication system of claim 9, wherein the digital filter is a band-pass filter configured to isolate a digital signaling spectrum.

12. The communication system of claim 7, wherein a first starting level is 4 mA and a first target level is 20 mA, and wherein a second starting level is 20 mA and a second target level is 4 mA.

13. A communication system, comprising:
    a step selector having a first input configured to receive a positive slew value, a second input configured to receive a negative slew value, and a third input configured to receive a comparison signal, the step selector configured to provide a slew step responsive to the comparison signal;
    a first adder circuit having a first input configured to receive the slew step and a second input, the first adder circuit configured to provide a current slew rate at an output;
    a memory device having an input coupled to the output of the first adder and an output coupled to the second input of the first adder;
    a second adder circuit having a first input configured to receive the current slew rate and a second input configured to receive a digital-to-analog converter (DAC) code, the second adder circuit configured to provide a next DAC code raw signal at an output;
    a latch having an input configured to receive the next DAC code raw signal and a rising-edge clock input configured to receive a clock signal, the latch configured to provide the DAC code;
    a comparison circuit having a first input configured to receive the DAC code and a second input configured to receive a transition value, the comparison circuit configured to provide the comparison signal;
    a digital-to-current converter configured to receive the DAC code and to provide a DC transient current transitioning between a starting level and a target level on a pseudo-sinusoidal path; and
    a third adder circuit having an output, a first input coupled to the DC transient signal and a second input adapted to be coupled to a Highway Addressable Remote Transducer (HART) signal.

14. A method of communication, comprising:
    providing a DC transient current rising from a first starting level to a mid point between the first starting level and a first target level at an accelerating slew rate and rising from the mid point to the first target level at a decelerating slew rate, the DC transient current falling from a second starting level to the mid point at the accelerating slew rate and falling from the mid point to a second target level at the decelerating slew rate;
    providing a HART signal;
    adding the DC transient current and the HART signal and providing a superimposed signal having an analog signaling spectrum and a digital signaling spectrum of HART communication protocol;
    transmitting the superimposed signal over a connector; and
    receiving the superimposed signal and isolating the analog signaling spectrum and the digital signaling spectrum.

* * * * *